United States Patent [19]

Satou

[11] 4,425,596

[45] Jan. 10, 1984

[54] ELECTRIC CIRCUIT BREAKER

[75] Inventor: Kouzou Satou, Mie, Japan

[73] Assignee: Tokyo Shibaura Denki Kabushiki Kaisha, Kawasaki, Japan

[21] Appl. No.: 301,823

[22] Filed: Sep. 11, 1981

[30] Foreign Application Priority Data

Sep. 26, 1980 [JP] Japan ................................. 55-134078
Apr. 28, 1981 [JP] Japan ................................. 56-65023

[51] Int. Cl.³ .......................................... H02H 3/08
[52] U.S. Cl. ..................................................... 361/93
[58] Field of Search ................................. 361/93-98

[56] References Cited

U.S. PATENT DOCUMENTS

| | | | |
|---|---|---|---|
| 2,957,109 | 10/1960 | White et al. | |
| 3,343,084 | 9/1967 | Gambale et al. | 361/97 X |
| 3,558,991 | 1/1971 | Brandt, Jr. et al. | 361/93 X |
| 3,914,667 | 10/1975 | Waldron | 361/94 |
| 4,156,262 | 5/1979 | Eller et al. | 361/93 X |

OTHER PUBLICATIONS

"Improved Static Over-Current Relay with IDMT Characteristic"-Gudta et al., J. Inst. Eng. (India), vol. 53, p. EL 3 (2/73).

Primary Examiner—Harry E. Moose, Jr.
Attorney, Agent, or Firm—Finnegan, Henderson, Farabow, Garrett & Dunner

[57] ABSTRACT

An electric circuit breaker including a current sensor composed of a Hall generator for detecting current overloads. Two secondary windings of a current transformer associated with the power line are connected to provide power to two separate power supply circuits. One circuit supplies power to a control circuit and the other circuit supplies control current to the Hall generator. The output voltage of the Hall generator is compared with a predetermined value in the control circuit. If a predetermined overload occurs, the control circuit energizes a trip coil for opening the power line.

8 Claims, 19 Drawing Figures

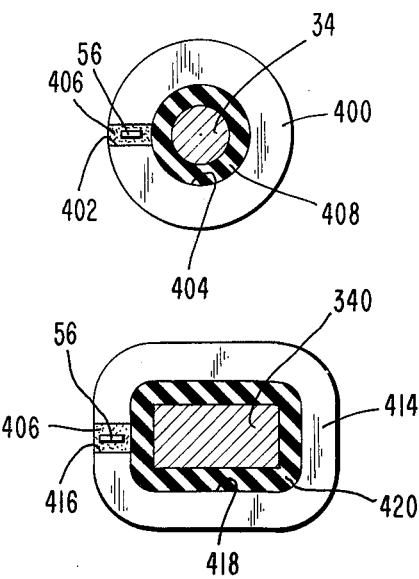
FIG. 11
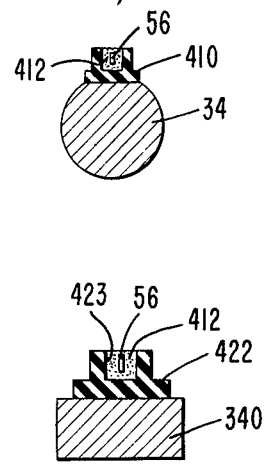
FIG. 12
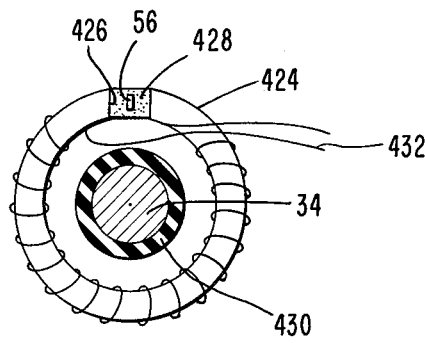
FIG. 13
FIG. 14
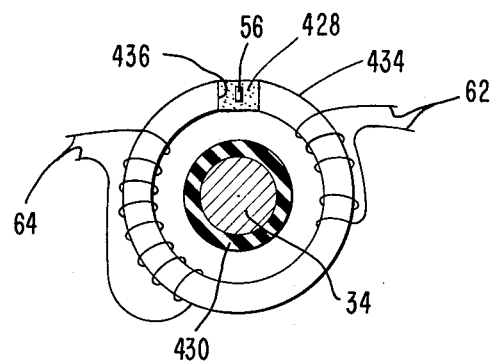
FIG. 15
FIG. 16
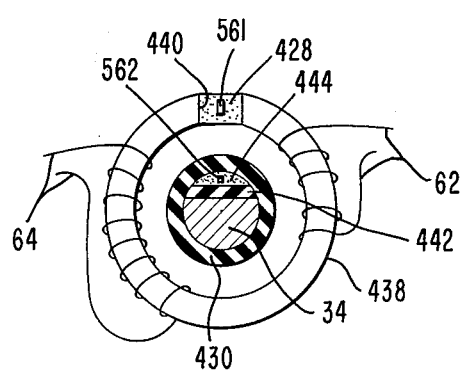
FIG. 17

ELECTRIC CIRCUIT BREAKER

BACKGROUND OF THE INVENTION

This invention relates to electric circuit breakers, and more particularly to an overcurrent protection device for use with an electric circuit breaker.

FIG. 1 is a circuit diagram of a prior art electric circuit breaker.

A three-phase power source 30 is applied to a three-phase load 32 by three lines 34. Contacts 36 are interposed in the lines between the power source 30 and the load 32. Three-phase load current through the lines 34 is detected by three current transformers 38. The output current of the current transformers 38 is rectified by full-wave diode rectifier 40. The output current of the rectifier 40 flows through a zener diode 42 and a resistor 44. The terminal voltage of the resistor 44 is applied to a control circuit 46. The output of control circuit 46 is applied to the base electrode of a transistor 48. A trip coil 50 for breaking the contacts 36 is connected in series with this transistor. The output current of the rectifier 40 is also applied to a power circuit 52 which supplies power to the control circuit 46.

When an overcurrent flows through the lines 34, a greater voltage appears across resistor 44. The control circuit 46 detects the input voltage as being abnormal, and provides an output signal to the base electrode of the transistor 48. The trip coil 50 is energized, and the contacts 36 are opened.

The current transformer 38 is thus used as a detector for detecting overcurrent conditions. The rated load current is, for example, three thousand amperes and the secondary rated current is normally fifty mA. Normally, each line 34 in the vicinity of the transformer 38 is formed as a bus bar. The primary windings of the current transformer 38 are thus constituted by the bus bars 34, so that the number of turns of each primary winding is one, and the number of turns of the secondary winding is, for example, sixty thousand. The resistance of the secondary winding is accordingly very large, as is the power consumption of the current transformer. Consequently, the secondary current of the current transformer is not proportional to the primary current when the load current is more than four or five times the rated current. Preferably, the secondary current ought to be proportional to the primary current even when the load current is ten to sixteen times the rated current so that the current transformer accurately detects the magnitude of even large overcurrent conditions. Additional problems with the use of this current transformer are that its manufacturing cost is high, because of the great number of turns required, and it also takes up a large space.

On the other hand, the current normally flowing through the secondary winding of the current transformer can be made larger by reducing the number of turns of the secondary winding. Since a resistive load is connected to the secondary winding, the power consumption of the secondary winding is $I^2R$. Since large load current can flow through the lines 34, power consumption in the secondary circuits can become quite large. Accordingly, the iron core of the current transformer must be made large. Should a short circuit occur, however, large undesirable overvoltages can be induced at the secondary winding. Consequently, the current transformer is designed to have a large number of turns in the secondary winding so that the secondary current is kept small.

SUMMARY OF THE INVENTION

It is an object of this invention to overcome the problems of the prior art by providing an electric circuit breaker in which a Hall generator is used for detecting an overload current.

According to this invention, an electric circuit breaker for interrupting load current flowing from a power source through a line to a load comprises a contact positioned in the line connecting the power source with the load; a sensor for detecting the load current flowing through the line and providing an output voltage in response thereto; means for comparing the output voltage with a predetermined value and providing a signal for opening the contact when the output voltage differs by a predetermined amount from the predetermined value; a current transformer connected to be responsive to the load current flowing in the line for applying power to the circuit breaker; and a power supply receptive to said applied power to supply current to the sensor and the comparing means.

Other objects and advantages will become apparent by a reading of the following specification in conjunction with the drawings in which:

BRIEF DESCRIPTION OF THE DRAWINGS

FIGS. 11 through 14 are front views of current sensors constructed according to this invention;

FIGS. 15 through 17 are front views of magnetic cores of current transformers constructed according to this invention;

DESCRIPTION OF THE PREFERRED EMBODIMENTS

Figure 2:
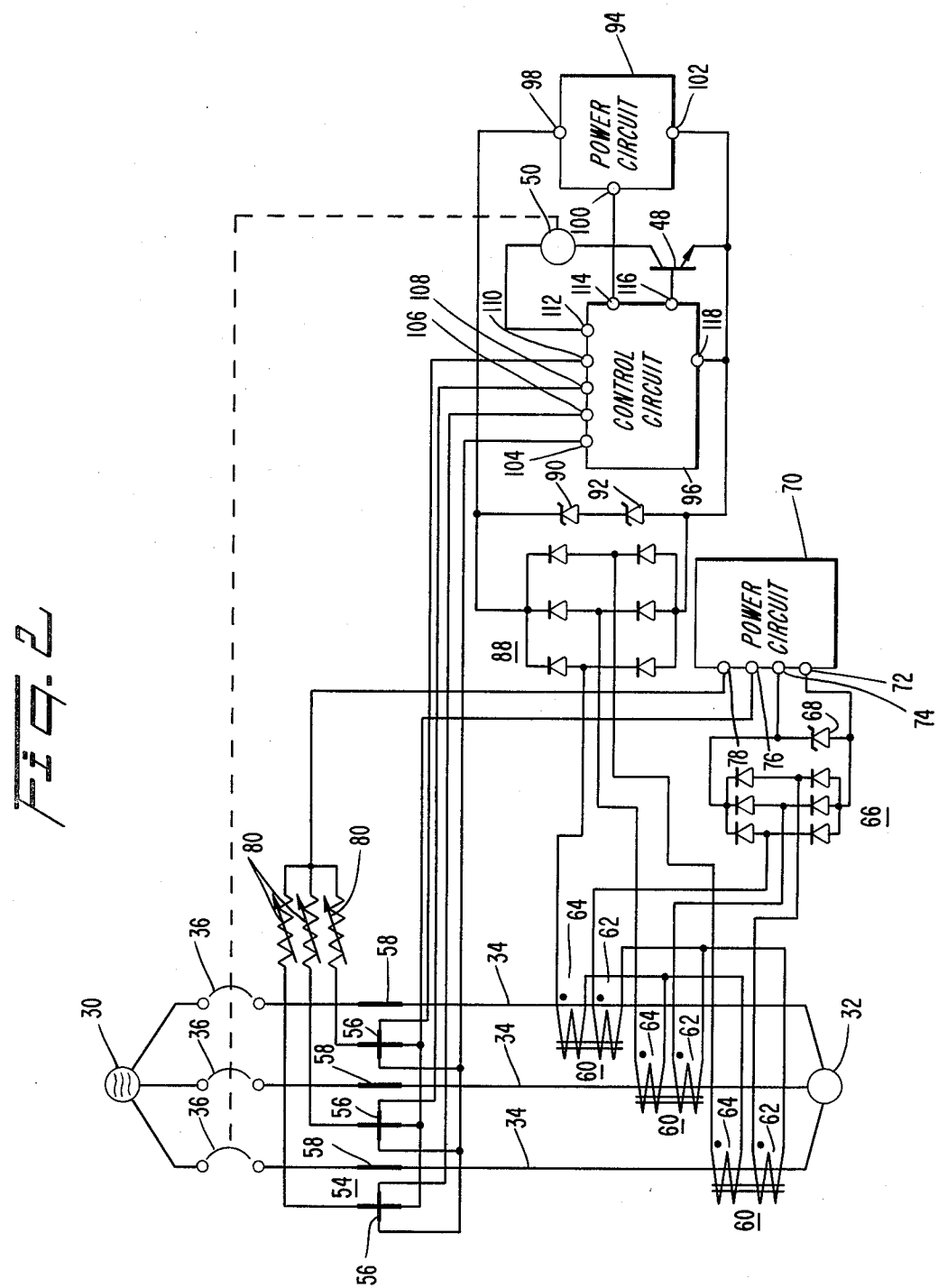
FIG. 2 is a circuit diagram of a preferred embodiment of an electric circuit breaker constructed according to this invention.

FIG. 2 is a circuit diagram of a preferred embodiment constructed according to this invention. A three-phase power source 30 is applied to a three-phase load 32 by three bus bars 34. Contacts 36 are interposed between the power source 30 and the load 32.

Current sensors identified generally by the numeral 54 are provided between the contacts 36 and the load 32. The current sensors 54 include Hall generators 56 positioned to interact with the section of the bus bars 58 shown as having an insulated surface. The preferred construction and operation of these Hall generators 56 and bus bar sections 58 are described hereinafter.

Current transformers 60 are provided between the current sensors 54 and the load 32. Each current transformer 60 has two secondary windings 62 and 64. The first secondary windings 62 are connected to a diode rectifier 66. A zener diode 68 is connected to the output terminals of the rectifier 66.

The terminal voltage of the zener diode 68 is applied to the input terminals 72 and 74 of the first power circuit 70. The output terminals 76 and 78 of the power circuit 70 are connected to the three Hall generators 56 and supply a control current to each Hall generator through its associated, series-connected variable resistor 80.

As shown, the outputs of the current sensors 54 are applied to input terminals 104, 106, 108 and 110 of the control circuit 96. A series circuit of a transistor 48 and a trip coil 50 for breaking the contacts 36 is connected to the control circuit 96 between output terminals 112 and 118. Another output terminal 116 of control circuit 96 is connected to the base of transistor 48.

The second secondary windings 64 of transformers 60 are connected to another diode rectifier 88. Two zener diodes 90 and 92 are connected to the output terminals of the rectifier 88. The terminal voltage across these zener diodes is applied to the input terminals 98 and 102 of the second power circuit 94. The output terminal 100 of this power circuit provides DC voltage to control circuit 96 via input terminal 114.

Figure 3:
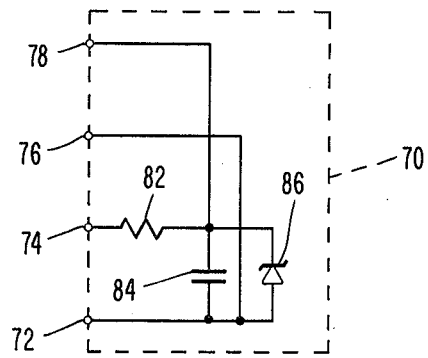
FIGS. 3 and 4 are circuit diagrams of power circuits shown in FIG. 2.

FIG. 3 is a diagram of the first power circuit 70 shown in FIG. 2. A series circuit of a resistor 82 and a capacitor 84 is interposed between the input terminals 72 and 74. A zener diode 86 is connected to the capacitor 84 in parallel. The terminal voltage of the zener diode 86 is applied to the Hall generators 56 via outputs 76 and 78.

Figure 4:
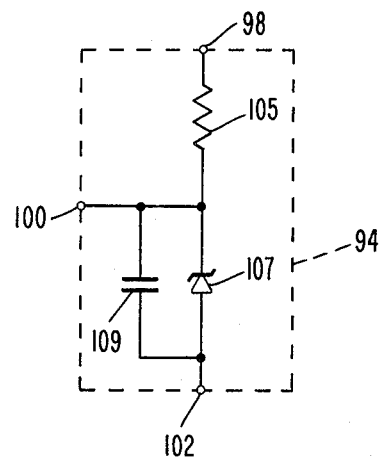

FIG. 4 is a diagram of the second power circuit 94 shown in FIG. 2. A series circuit of a resistor 105 and a zener diode 107 is connected to the input terminals 98 and 102. A capacitor 109 is connected to the zener diode 107 in parallel. The output of circuit 94 is provided at terminals 100 and 102.

Figure 5:
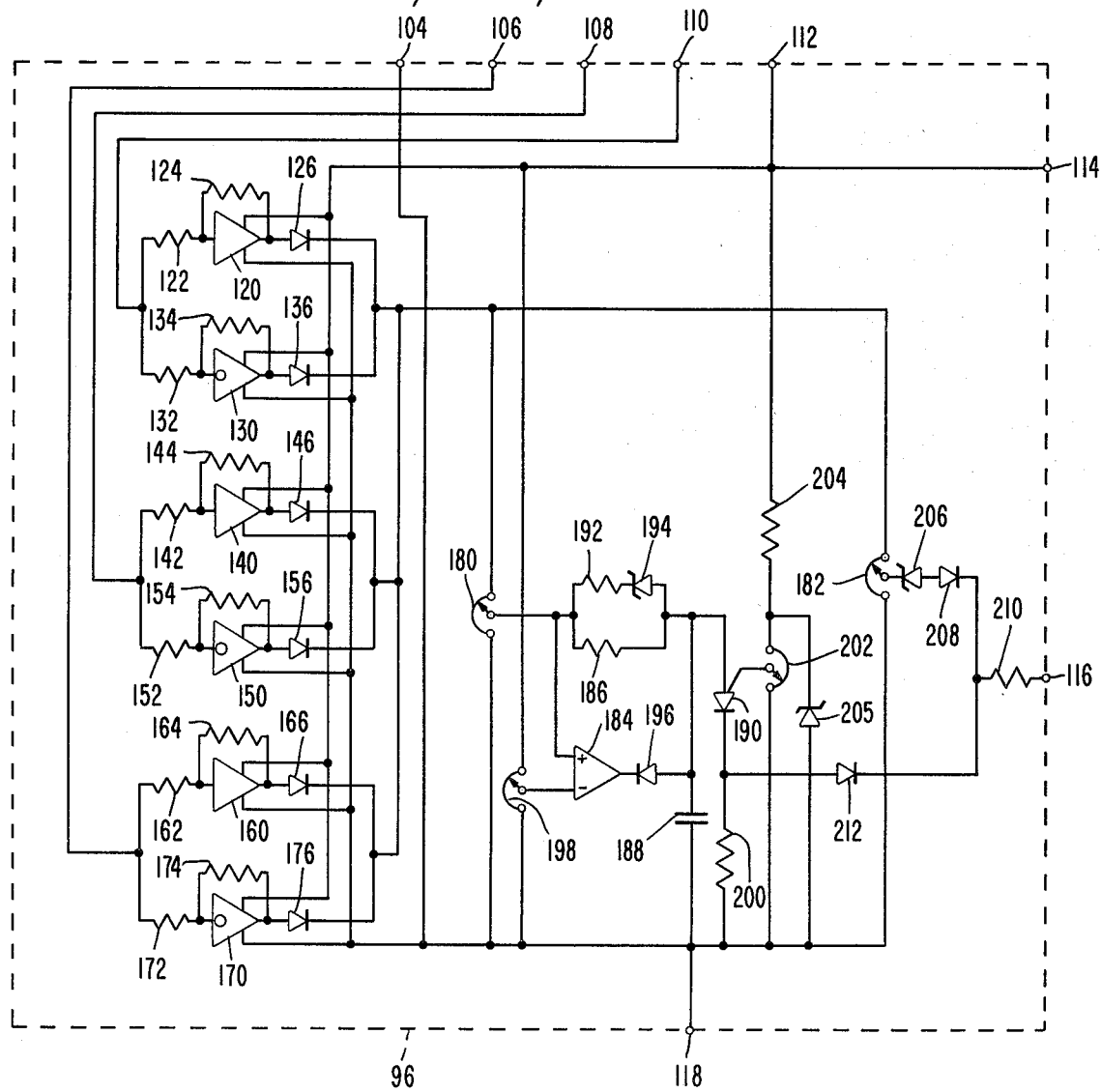
FIG. 5 is a circuit diagram of a control circuit shown in FIG. 2.

FIG. 5 is a diagram of the control circuit 96. The output voltages of the current sensors 54 are applied to the terminals 106, 108 and 110. Terminal 104 is connected to the common return line. The input terminal of a non-inverting operational amplifier 120 is connected to the terminal 110 through a resistor 122. A resistor 124 is interposed between the input and the output terminals of the operational amplifier 120. The anode of diode 126 is connected to the output terminal of the operational amplifier 120.

The input terminal of an inverting operational amplifier 130 is connected to the terminal 110 through a resistor 132. A resistor 134 is interposed between the input and the output terminals of the operational amplifier 130. The anode of diode 136 is connected to the output terminal of the operational amplifier 130.

Non-inverting operational amplifiers 140 and 160, and inverting operational amplifiers 150 and 170 are connected in an identical manner with their respective resistors and diodes as has just been described for operational amplifiers 120 and 130. The operational amplifiers 120, 130, 140, 150, 160 and 170 are supplied DC bias voltage through the terminal 114.

Input 108 is connected to the pair of amplifiers 140, 150, and input 160 is connected to the pair of amplifiers 160, 170. The output of all six amplifiers is taken from the cathodes of diodes 126, 136, 146, 156, 166 and 176 which are connected to each other and to terminals of rheostats 180 and 182. The other terminals of rheostats 180 and 182 are connected to the terminal 118 which forms the circuit ground.

The wiper of rheostat 180 is connected to the positive input of a comparator 184 and one terminal of a resistor 186. The other terminal of the resistor 186 is connected to one terminal of a capacitor 188 and the anode of a programmable unijunction transistor 190. The other terminal of the capacitor 188 is connected to the terminal 118. A series circuit of a resistor 192 and a zener diode 194 is connected in parallel with resistor 186. A diode 196 is interposed between the output of the comparator 184 and the anode of the unijunction transistor 190. Another rheostat 198 is connected between terminals 114 and 118. The wiper of the rheostat 198 is connected to the negative input of the comparator 184.

A resistor 200 is interposed between the cathode of the unijunction transistor 190 and the terminal 118. A rheostat 202 is connected between terminals 112 and 118 through a resistor 204. The wiper of rheostat 202 is connected to the trigger electrode of the unijunction transistor 190. The terminals 112 and 114 are connected to each other. A zener diode 205 is connected in parallel with rheostat 202.

The wiper of rheostat 182 is connected to the terminal 116 through zener diode 206, diode 208 and resistor 210. The anode of diode 212 is connected to the cathode of the unijunction transistor 190, and the cathode of diode 212 is connected to the cathode of diode 208.

With reference to FIGS. 2-5, the operation of the first preferred embodiment of the circuit breaker invention will now be described. Current is supplied to the three-phase load 32 from source 30 through the bus bars 34 and the primary windings of the current transformers 60. The function of this circuit breaker is to prevent excessive currents from causing damage at load 32.

The alternating current in secondary windings 62 is converted to a direct current by the rectifier 66 and applied to the power circuit 70. The purpose of zener diode 68 is to suppress the overvoltage of the secondary windings 62 by breaking down when an overcurrent condition such as caused by a short circuit occurs in the three-phase circuit.

Within power circuit 70 (FIG. 3), the current out of the rectifier 66 is applied to the series circuit of the resistor 82 and the zener diode 86. The zener voltage of the diode 86 provides the constant output voltage of the power circuit 70 for the Hall generators. The capacitor 84 smooths the DC voltage. The output voltage of the power circuit 70 is applied to the Hall generators 56 through the variable resistors 80, causing a control current to flow through each of the Hall generators 56.

The output current of secondary windings 64 are converted to DC by rectifier 88 and applied to the power circuit 94. Zener diodes 90 and 92 serve the same function as zener diode 68.

Within power circuit 94 (FIG. 4), the direct current from rectifier 88 is applied to the series circuit of the resistor 105 and the zener diode 107. The zener voltage of diode 107 provides the constant output voltage of the power circuit 94. The capacitor 109 is charged to the level of zener diode 107 and smooths the DC voltage which is applied to the control circuit 96.

The Hall generators 56 are conventional in operation. Control current flows from power circuit 70 through the Hall generators. Load current is at the same time flowing through the bus bars 34 to produce a magnetic flux at each bus bar. Each Hall generator is oriented so that the magnetic flux from its associated bus bar passes through the Hall generator perpendicular to its surface. Each Hall generator 56 thereby produces a voltage output that is proportional to the load current through its associated bus bar 34. The strength of the magnetic fields which are induced is based upon the magnitude of the load current. However, the characteristics of the Hall generators 56 are not identical, and accordingly, the control current flowing through each Hall generator 56 can be adjusted by the variable resistors 80 so that the output of each Hall generator is normally the same.

The AC output voltages of the three Hall generators 56 are applied to the terminals 106, 108 and 110, respectively. Referring to FIG. 5, the positive half-way voltages of the Hall generators 56 are amplified by the non-inverting operational amplifiers 120, 140 and 160. The negative half-wave voltages of the Hall generators 56 are amplified to a positive voltage by the inverting operational amplifiers 130, 150 and 170. The combined output voltage of the operational amplifiers 120, 130, 140, 150, 160 and 170 is thus a series of positive peaks and these peaks, including the largest in magnitude appearing at the output of any amplifier appear across the rheostat 180. A preset fraction of this output voltage of the amplifiers is tapped off by the wiper of rheostat 180 and applied to the positive input of comparator 184.

The preset, divided voltage of rheostat 198 forms the reference voltage applied to the negative input of the comparator 184. Normally, the output voltage of comparator 184 is about zero, since the voltage of the positive input of the comparator 184 is less than the reference voltage of the predetermined value. Accordingly, diode 196 is forward-biased and the capacitor 188 is not charged.

On the other hand, when the load current is bus bars 34 is at an abnormal level, the voltage at the positive input of comparator 184 becomes larger than the reference voltage. The comparator 184 provides an output voltage which back biases diode 196. Accordingly, capacitor 188 is charged through the resistor 186 by the tapped voltage at rheostat 180.

If the voltage on capacitor 188 rises to a level where it is equal to the tapped voltage of rheostat 202, unijunction transistor 190 is triggered conducting. A positive voltage is applied to the base electrode of transistor 48 (FIG. 2) through diode 212 and resistor 210. Transistor 48 becomes conductive, and the trip coil 50 is energized by the output of power circuit 94. The charge accumulated on capacitor 109 in power circuit 94 (FIG. 4) sustains this energization of trip coil 50. The current flow path is from terminal 114 to terminal 112, through the trip coil 50 and conducting transistor 48. Consequently, contacts 36 are opened.

The magnitude of the voltage at the rheostat 180 is determined by the magnitude of the load current in the bus bars 34. This current thus determines the time it takes to charge capacitor 188 and trigger unijunction transistor 190. Such the magnitude of the load current becomes sufficiently excessive to raise the tapped voltage at rheostat 180 above the breakdown voltage of zener diode 194, the capacitor 188 is charged more quickly through the parallel circuit of resistor 186 and resistor 192 and zener diode 194 so that unijunction 190 is much more quickly triggered.

Furthermore, if a short circuit occurs creating large overcurrents in the bus bars, even quicker actuation of trip coil 50 is demanded. In that case, the tapped voltage of the rheostat 182 is compared to the zener voltage of the diode 206. If this tapped voltage is larger than the zener voltage, the zener diode 206 breaks down and a voltage is applied to the base electrode of transistor 48 causing it to conduct. Contacts 36 are thus immediately opened by the trip coil 50 in the short circuit condition. Under most overcurrent conditions, however, the tapped voltage at rheostat 182 would be less than the zener voltage of the diode 206.

The setting of rheostat 180 establishes the point that the current level in bus bars 34 must attain before the timing sequence begins. The trip time for actuating trip coil 50 for a specific overcurrent condition can be varied by adjustment of rheostat 202 because this rheostat determines the level to which capacitor 188 must charge before unijunction 190 conducts. The circuit associated with rheostat 180 is thus used to control the tripping of trip coil 50 when the load current is within the predetermined overload current range less than a short circuit condition.

The current transformers 60 are not used to provide an output current proportional to the load current, since the current transformers are only used as a power source for the power circuits 70 and 94. Accordingly, the current transformer 64 can utilize an inexpensive and small iron core without concern that the core might become saturated during the half-wave cycles in contrast to the prior art where the output signal must be proportional to the load current. As an example, the core can be a powdered core which is easily formed and less expensive than a laminated iron core.

Figure 1:
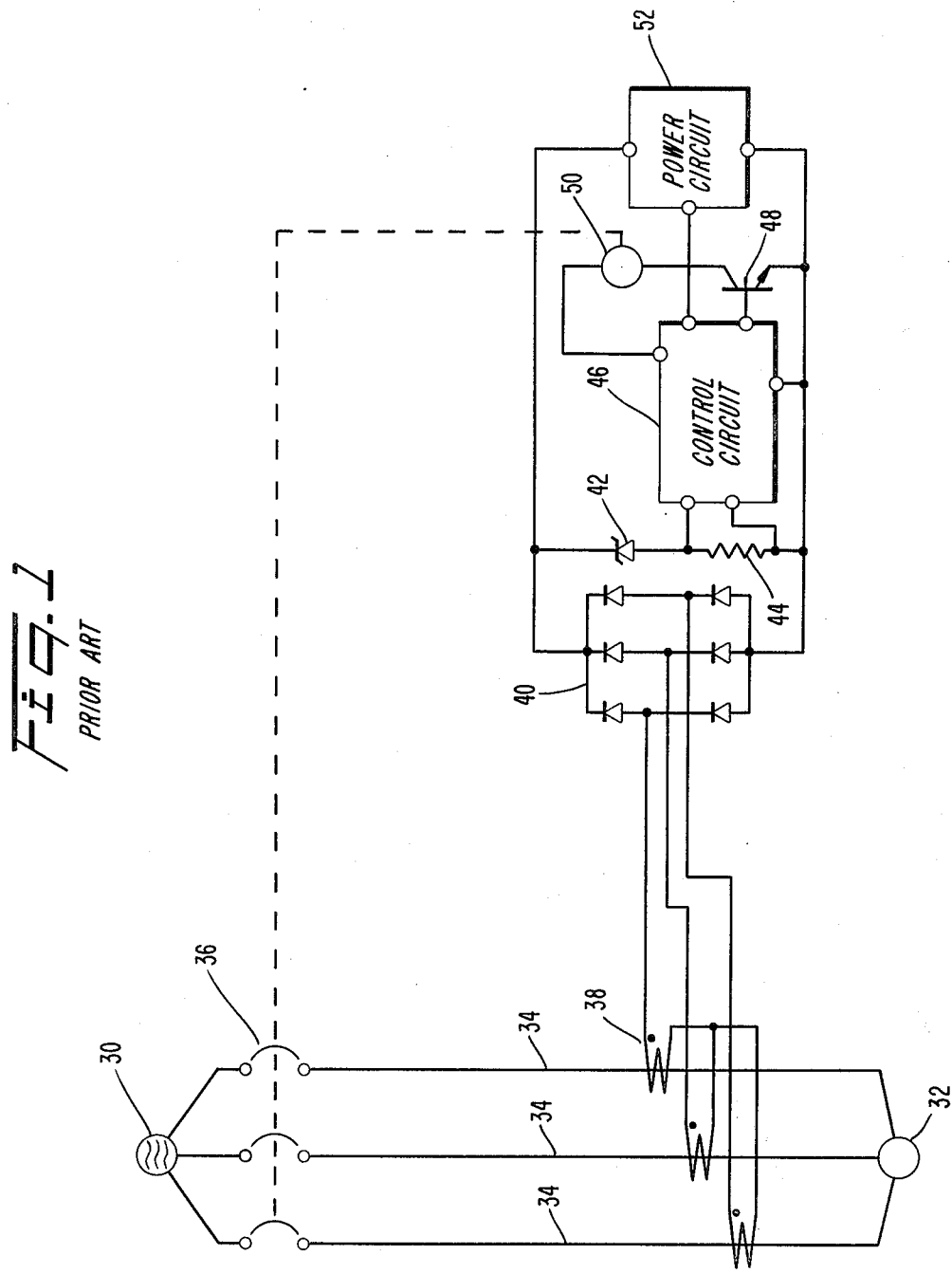
FIG. 1 is a circuit diagram of a prior art electric circuit breaker.

In the case of the circuit in FIG. 1, the output of the current transformers 38 is used both as the power source of the power circuit 52 and the signal to detect overcurrents. The secondary output of the current transformer 38 becomes large when the load current becomes several times the rated load current. In this case, the magnetic flux of the current transformer 38 becomes saturated causing the output of the secondary of the current transformer 38 to become a series of sharp spikes in contrast to a sine wave. A large filter circuit is thus needed to smooth this output. In FIG. 2, the secondary output of the current transformer 60 is constant since the zener diodes 68 is connected to the secondary winding 62 of the current transformer through the rectifier 66. The zener diodes 90 and 92 are similarly used. When the load current is large, the secondary output of the current transformer 60 is constant. Accordingly, the filter circuits in the power circuits 70 and 94 can be kept very simple in comparison with that of the power circuit 52 in FIG. 1.

The control current terminals and the output terminals are not insulated from each other in the Hall generators 56. The control current flowing through the Hall generators 56 is supplied from the secondary windings 62 of the current transformers 60. The output voltages of the Hall generators 56 are applied to the control circuit 96. The control circuit 96 is connected to the secondary windings 64 of the current transformers 60 through the rectifier 88. Accordingly, the control current input terminals of the Hall generators 56 are effectively insulated from the output voltage terminals since the secondary windings 62 and 64 of the current transformers 60 are isolated from each other.

Figure 6:
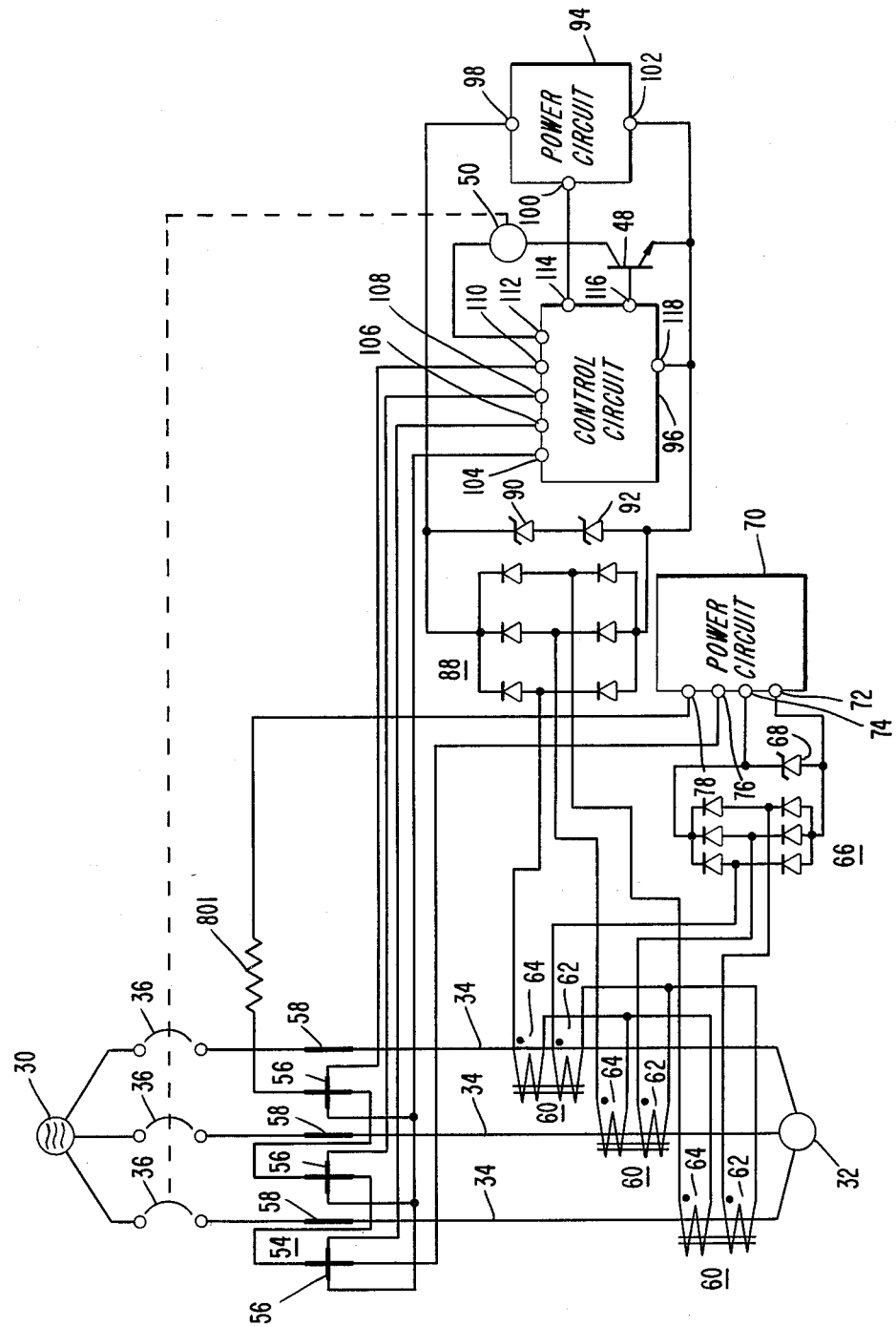
FIGS. 6, 7 and 9 are circuit diagrams of alternative embodiments constructed according to this invention.

FIG. 6 is a circuit diagram of the second preferred embodiment constructed according to this invention. The Hall generators 56 in current sensor 56 are connected in series instead of in parallel as shown in FIG. 2. The control current from the power circuit 70 is applied to the Hall generators 56 in series through a single resistor 801. When each of the Hall generators 56 has essentially the same characteristics, and the magnetic fields which are generated in response to the magnitude of the load current are very nearly of the same magnitude, the circuit in FIG. 6 can be used. Power circuits 70, 94 and control circuit 96 are constructed in the same manner as are these circuits in FIG. 2.

Figure 7:
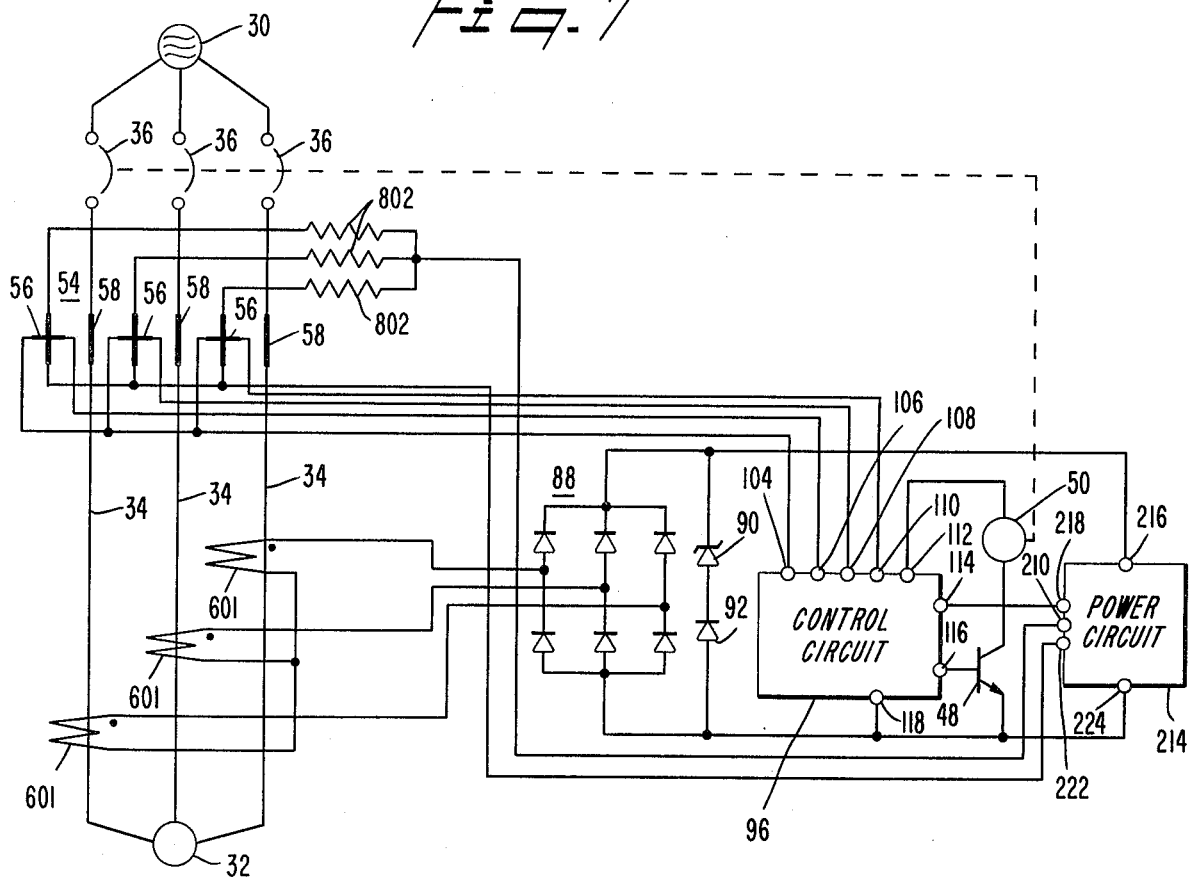

FIG. 7 is a circuit diagram of the third preferred embodiment constructed according to this invention. Here, a current transformer 601 is provided at each bus bar having only one secondary winding. The output of the current transformers 601 are applied to the rectifier 88. The DC voltage output of the rectifier 88 is applied to terminals 216, 224 of the power circuit 214. The power circuit 214 provides a DC voltage output at 218, 224 which is applied to the control circuit 96. This control circuit 96 is constructed in the same manner as control circuit 96 in FIG. 2. Another output of power circuit 214 is applied as a control current to each of the Hall generators in parallel through a separate resistor 802.

Figure 8:
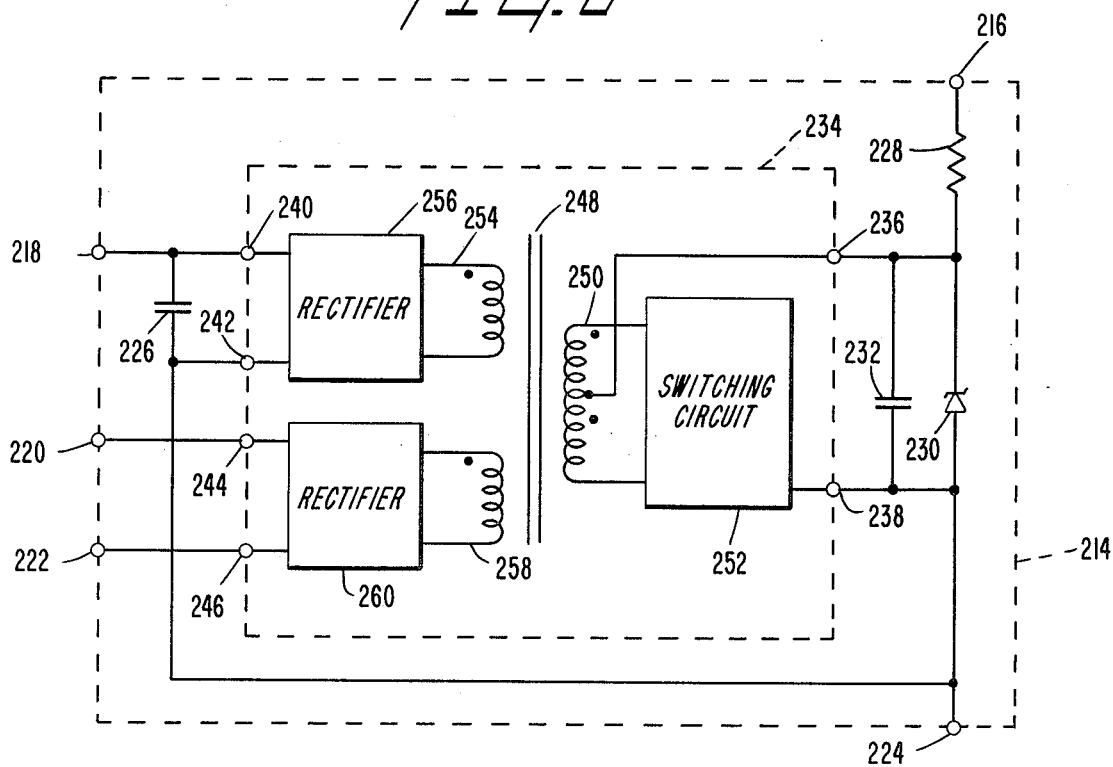
FIG. 8 is a circuit diagram of a power circuit shown in FIG. 7.

FIG. 8 is a circuit diagram of the power circuit 214. A series circuit of a resistor 228 and a zener diode 230 is interposed between the terminals 216 and 224. A smoothing capacitor 232 is connected to the zener diode 230 in parallel. The voltage across zener diode 230 is applied to input terminals 236, 238 of a DC—DC converter 234.

DC—DC converter 234 includes a transformer 248. The primary winding 250 of the transformer is connected to the output of a conventional multivibrator type switching circuit 252. The middle of the primary winding 250 is connected to the terminal 236. The first secondary winding 254 is connected to a well-known diode rectifier 256. The output terminals of the rectifier 256 are 240 and 242 across which storage capacitor 226 is connected. Terminal 240 is also connected to output terminal 218 of the power circuit, and terminal 242 is connected to output terminal 224. The second secondary winding 258 is connected to another diode rectifier 260. The output terminals of the rectifier 260 are 244 and 246 which are connected, respectively, to output terminals 220, 222 of the power circuit 214.

In operation, the zener voltage of the diode 230 is applied to converter 234 at terminals 236 and 238. This DC voltage serves as the bias voltage for the multivibrator 252 which provides a square wave output across primary 250. The continuous square wave signal across secondary windings 254 and 258 are rectified by the rectifiers 256 and 260, respectively. The output of the rectifier 260 is applied to the Hall generators 56 at terminals 220, 222. Capacitor 226 is charged by the output of rectifier 256. The charge on the capacitor 226 is used for energizing the trip coil 50 in the same manner as does capacitor 109 in FIG. 4.

In this embodiment, the control current to the Hall generators 56 provided by the power circuit 214 is insulated from the output voltages of the Hall generators 56 by the transformer 248.

Figure 9:
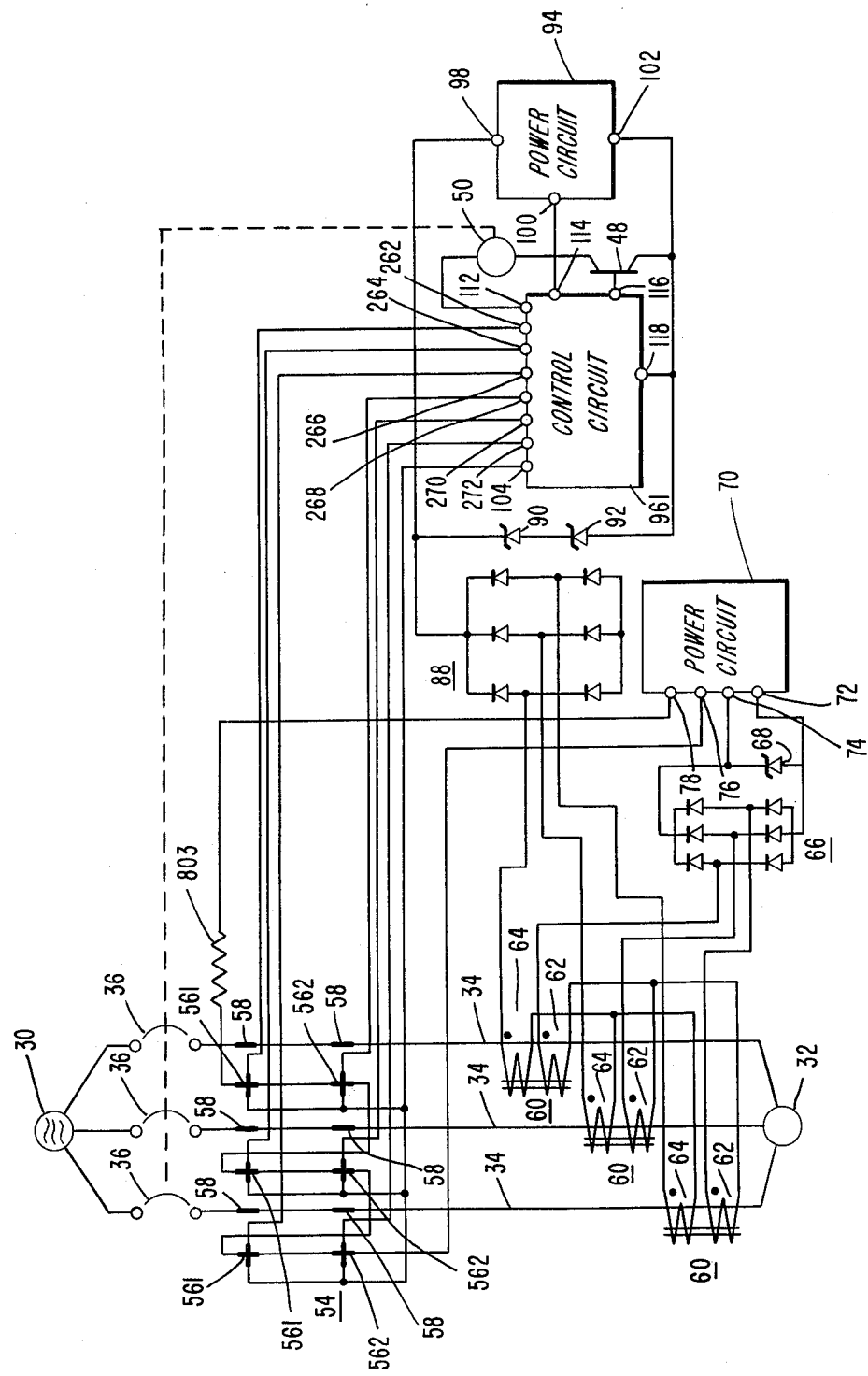

FIG. 9 is a circuit diagram of the fourth embodiment constructed according to this invention.

The current sensor 54 is composed of a pair of Hall generators 561 and 562 associated with each bus bar 34. The output voltage of the power circuit 70 provides the control current to the six Hall generators in series through a resistor 803. The first group of Hall generators 561 detects a first range of tripping currents which can be called small overcurrents. The second group of Hall generators 562 detects a second range of tripping currents which is larger than the first range of tripping currents and can be called large overcurrents. The output voltages of the Hall generators 561 and 562 are applied to the terminals 262, 264, 266, and 268, 270, 272, respectively. Input 104 is connected to the common return line.

Figure 10:
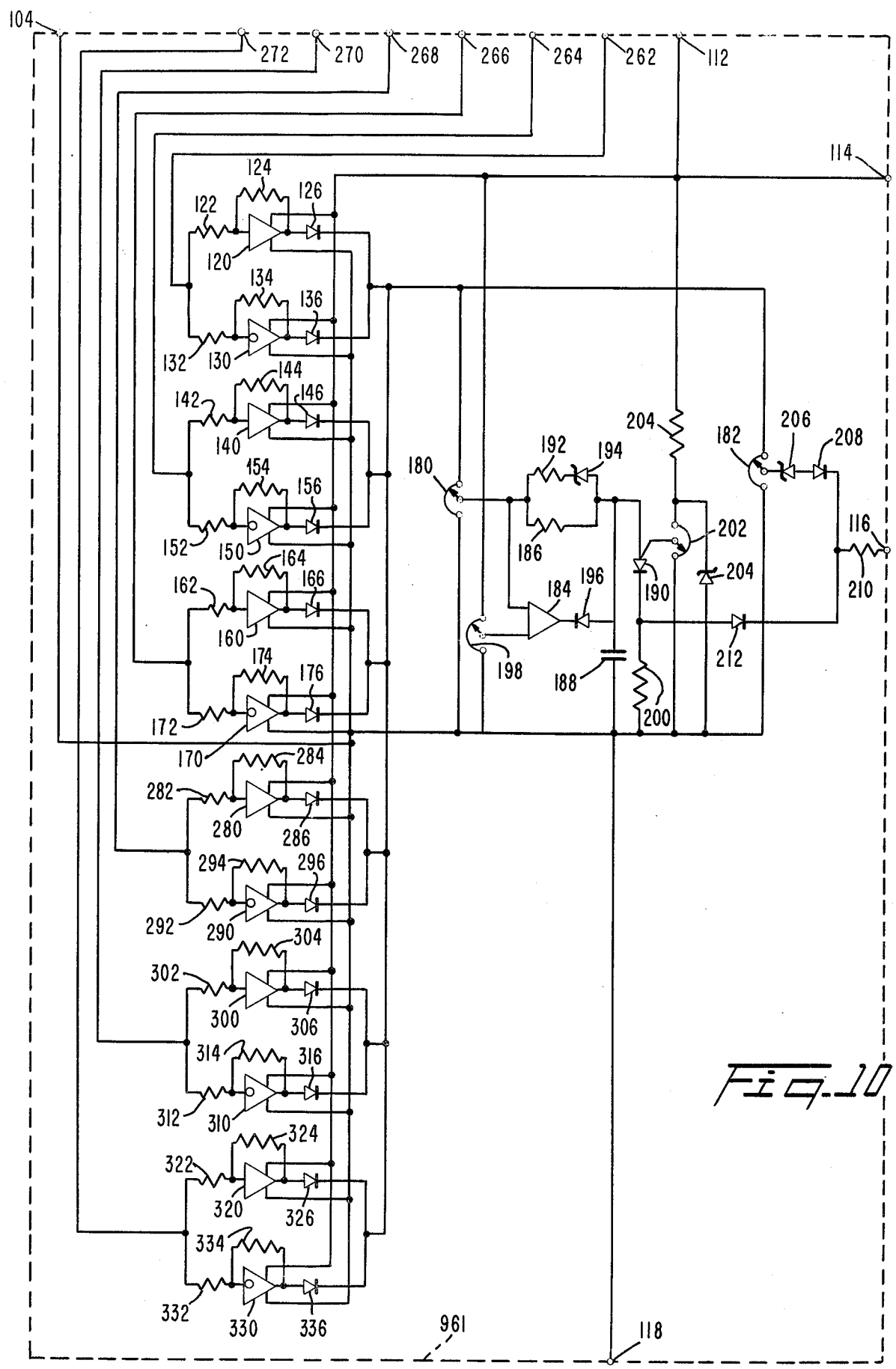
FIG. 10 is a circuit diagram of a control circuit shown in FIG. 9.

FIG. 10 is a circuit diagram of a control circuit 961. As shown in FIG. 10, non-inverting operational amplifiers 280, 300, 320 and inverting operational amplifiers 290, 310, 330 and their respective associated resistors and diodes are connected in the same manner as the input amplifying circuits shown in FIG. 5. The other elements of the control circuit 961 are connected in the same manner as control circuit 96 shown in FIG. 5. The output of all of the amplifiers are connected through their respective diodes to rheostats 180 and 182.

The output voltages of the Hall generators 561 (FIG. 9) are applied to the terminals 262, 264 and 266 which are respectively connected to the pairs of amplifiers 120, 130, 140, 150, and 160, 170. The output voltages of the Hall generators 562 are applied to the terminals 268, 270 and 272 which are respectively connected to the pairs of amplifiers 280, 290, 300, 310, and 320, 330. The amplification factors of the operational amplifiers 280, 290, 300, 310, 320 and 330 are set higher than those of the operational amplifiers 120, 130, 140, 150, 160 and 170. Accordingly, when the load current is within the second range, the amplified voltage output of the Hall generators 562 is larger and is applied to the rheostat 180 or 182. The operation of the remainder of this circuit 961 is identical to that of circuit 96 in FIG. 5. If the load current is within the first range, the Hall generators 562 cannot detect the load current as described hereinafter, but the Hall generators 561 do detect the load current to provide an output which is amplified and applied to rheostat 180. The first range of overcurrents can include, for example, up to seven times rated load current. The second range would include overcurrents larger than seven times rated load current. In this second range, the amplified output of Hall generators 562 would be sufficient to cause zener diode 194 to break down and reduce the trip time by the charge path through resistor 192. If in this second range the overcurrent reaches nearly ten times rated load current, for example, the amplified voltage output of the Hall generators 562 applied to the rheostat 182 would be sufficient to break down zener diode 206 to obtain an immediate trip. The setting of rheostat 182 can thus predetermine a "short-circuit" condition.

Figure 18:
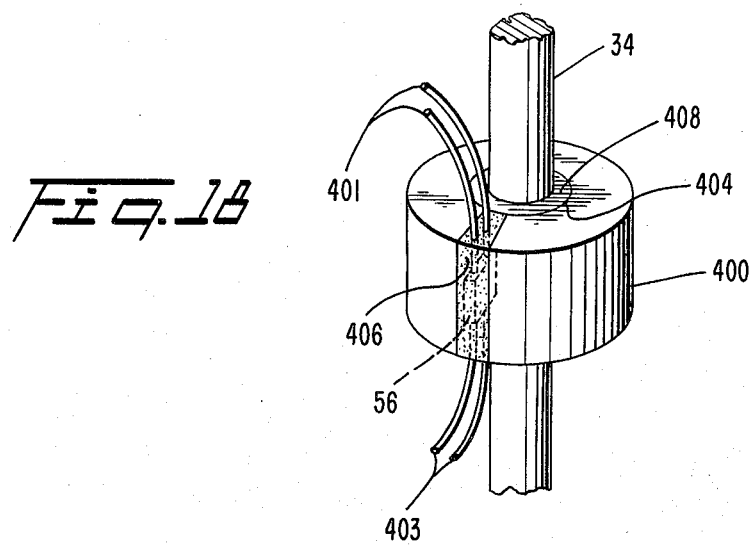
FIG. 18 is a perspective view of the current sensor of FIG. 11.

FIG. 11 is a cross-sectional front view of a current sensor 54 constructed according to this invention and FIG. 18 is a perspective view of the current sensor. An annular magnetic core such as an iron core 400 has an air gap 402 and a central aperture 404. Hall generator 56, shown here as a flat conductor, is positioned and retained in the air gap 402 by an insulating compound 406. Insulated bus bar 34 passes through the aperture 404 of the iron core 400. Insulation 408 is preferably a separate spacer positioned between the iron core 400 and the bus bar 34.

Core 400 concentrates the magnetic flux through the air gap so that flux caused by small currents is detected at current sensor 54. The flux passes perpendicular through the Hall generator, and the output voltage of the Hall generator 56 is proportional to the load current through bus bar 34.

Since the iron core 400 has an air gap 402, the magnetic reluctance is large. The magnetic flux of this core does not become saturated under normal overload current conditions. Even though the load current may contain a DC component, the magnetic flux of the iron core 400 is not saturated. The DC component is a transient current of the short circuit condition. An advantage is that the output of the Hall generators remain proportional to the load current.

FIG. 12 is a second embodiment of the current sensor according to this invention. The insulated spacer 410 is secured to the bus bar 34. The Hall generator 56 is embedded in the insulating compound 412 and is positioned on the insulated spacer 410.

When the load current becomes several hundred amperes, the current sensor 54 can detect the load current without need for the magnetic core. Since no core is used, saturation is not attained, and the current sensor output remains proportional to the load current.

FIG. 13 is a third embodiment of the current sensor according to this invention. A rectangular iron core 414 has an air gap 416 and a central opening 418. The Hall generator 56 is retained in the air gap 416 by an insulating compound 406. A rectangular bus bar 340 passes through the opening 418 of the iron core 414. The insulated spacer 420 is again located between the iron core 414 and the bus bar 340. This sensor functions in the same manner as that of FIG. 11.

Figure 19:
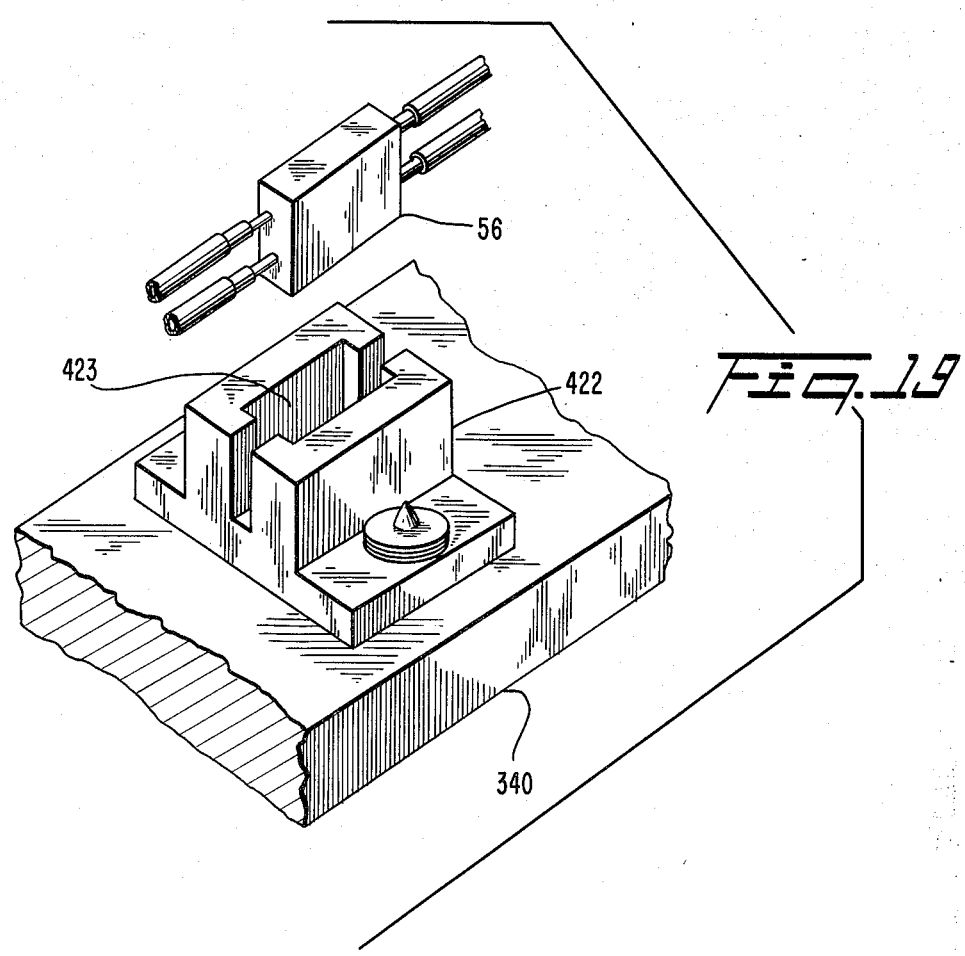
FIG. 19 is a perspective view of the current sensor of FIG. 14.

FIG. 14 is a fourth embodiment of the current sensor constructed according to this invention and FIG. 19 is a perspective view of the current sensor. The insulated spacer 422 is secured to the top of rectangular bus bar 340. The Hall generator 56 is positioned in the hole 423 of the insulated spacer 422 and there retained by the insulated compound 412 in which it is embedded. This sensor functions in the same manner as that of FIG. 12.

In cases where the bus bar 34 is of circular cross-section, the current sensor 54 shown in FIG. 11 or 12 can be used. In cases where the bus bar 34 is of rectangular cross-section, the current sensor 54 shown in FIG. 13 or 14 can be used. The current sensors 56 shown in FIGS. 11 through 14 are capable of being used with any of the circuits of FIGS. 2, 6 or 7. Preferably, the same sensor configuration is used with each of the bus bars in a circuit. For example, assuming the circuit of FIG. 2 had bus bars 34 with a circular cross-section and the configuration of FIG. 11 was selected, each insulated bus bar position 58 would be formed as bus bar 34 and spacer 408, while each sensor 54 would be formed as core 400, insulating compound 406, and the flat conductor through which the control current is supplied. Leads 401 and 403 shown in FIG. 18 would be connected to the flat conductor to introduce the control current to the Hall generator and to remove the output voltage therefrom.

In the circuit shown in FIG. 9 where a pair of current sensors are associated with each bus bar, the current sensors 56 shown in FIGS. 11 and 12 or FIGS. 13 and 14 are applicable, depending on whether the bus bar 34 has a circular or rectangular cross-section, respectively. The first Hall generators 561 and insulated bus bars 58 are constructed as shown in FIG. 11 and the second Hall generators 562 and insulated bus bars 58 are constructed as shown in FIG. 12, where the bus bars are cylindrical. Similarly, where the bus bars are rectangular, the first Hall generators 561 and insulated bus bars 58 are constructed as shown in FIG. 13. The second Hall generators 562 and bus bars 58 are constructed as shown in FIG. 14.

In the case of relatively small load current, for example, less than seven times rated load current, the current sensor 54 shown in FIG. 11 or 13 can be used. In this case, the Hall generator can detect load currents as low as several amperes.

Where the overcurrent is one and one-half times rated load current, the trip time is about eighty seconds. If the overcurrent is six times rated load current, the trip time is generally about eight seconds. Although the overload current which flows through the bus bars may contain a DC component, that is, a transient current, the DC component has little influence upon the trip characteristics since the trip time is relatively long.

Where the overcurrent is seven through twenty times rated load current, the current sensor 54 shown in FIG. 12 or 14 can be used, by way of example, in contrast to the current sensor 54 shown in FIGS. 11 and 13. As shown, the latter has small air gaps to reduce the magnetic resistance, and the mass of the iron core 400 or 414 is also small. If a short circuit occurs, the current flowing through the bus bar has a large DC component and the magnetic circuit of the magnetic core 400 or 414 is saturated. The Hall generator 56 thus cannot provide a voltage output proportional to a large overcurrent.

On the other hand, the current sensor 54 shown in FIG. 12 or 14 does not use a magnetic circuit having an iron core. Accordingly, the Hall generator 56 can provide a voltage output proportional to even a short-circuit current, even though the short circuit current has a large DC component.

Thus, in the case where it is expected that fault conditions can cause the load current to vary from several amperes to several thousand amperes, smaller load currents can be detected by a current sensor 54 such as shown in FIG. 11 or 13, and larger load currents can be detected by a current sensor as shown in FIG. 12 or 14. This combination of current sensors can thus be used in a circuit as shown in FIG. 9.

FIG. 15 is a fifth embodiment of the current sensor made according to this invention in which the current transformer winding is formed on the same iron core. As shown, an annular iron core 424 has an air gap 426 in which a Hall generator 56 is positioned and there retained by an insulating compound 428. The bus bar 34 with an insulated spacer 430 passes through the center of the iron core 424. The iron core 424 is shown as having a secondary winding 432. In this embodiment, and with reference for example to the circuit of FIG. 7, the iron core 424 serves as the magnetic core for the secondary winding 432 of a current transformer 601 and as a current sensor 54, both of which are associated with the same bus bar 34.

FIG. 16 is a sixth embodiment of a current sensor made according to this invention. An annular iron core 434 again has an air gap 436, with the Hall generator 56 positioned in the air gap 436 and there retained by the insulating compound 428. The bus bar 34 with its insulated spacer 430 passes through the center of the iron core 434. The iron core 434 has two secondary windings wound thereon, and with reference to FIGS. 2 and 6, for example, these windings would serve as windings 62 and 64 associated with a single tranformer 60. The iron core 434 thus commonly serves both a current transformer 60 and a current sensor 54 on the same bus bar 34.

FIG. 17 is a seventh embodiment of a current sensor constructed according to this invention. It finds special utility in a circuit such as shown in FIG. 9 where a pair of current sensors are connected to be responsive to a single bus bar 34. An annular iron core 438 has an air gap 440, with the first Hall generator 561 positioned in the air gap 440 and there retained by the insulating compound 428. An insulating spacer 442 is secured to the top of bus bar 34. The second Hall generator 562 is embedded in the insulating compound 444 and retained upon spacer 442. A second insulating spacer 430 surrounds the bus bar 34, spacer 442, generator 562 and compound 444, and this entire structure is positioned in the center of the iron core 438. Core 438 has two secondary windings 62 and 64 of current transformer 60. The iron core 438 is thus commonly associated with a current transformer 60 having two secondaries, and two current sensors, all responsive to the same bus bar 34.

In the case of a short circuit, the magnetic circuit of the current sensor within the iron core in FIGS. 15 through 17 may become saturated. Even though the output of Hall generator 56 is not proportional to the load current the output current of the current transformer 60 can still be used to power circuits 70 and 94 because distortion is of no concern.

Furthermore, as described earlier, even in cases of relatively large load current, there is no saturation problem if the current sensor 54 is used which does have an iron core, e.g., the current sensor in FIGS. 12, 14 and 17. The output of the Hall generator stays proportional to load current, and the output of the current transformer 60 provides enough current to power circuits 70 and 94.

What is claimed is:

1. An electric circuit breaker for interrupting load current flowing from a power source through a line to a load, comprising:
   a contact positioned in the line connecting the power source with the load;
   Hall generator sensor means in proximity with the line for detecting the load current flowing through the line and providing an output voltage in response thereto, said sensor means comprising first and second Hall generators, said first Hall generator for detecting a first preset range of load current and said second Hall generator for detecting a second preset range of load current longer than the first range;
   means for comparing the output voltage with a predetermined value and providing a signal for opening said contact when said output voltage differs from said predetermined value;
   a current transformer connected to be responsive to the load current flowing in said line for applying power to said circuit breaker; and
   a power supply being receptive to said applied power to supply current to said sensor means and said comparing means.

2. An electric circuit breaker for interrupting load current flowing from a power source through a line to a load, comprising:
   a contact positioned in the line connecting the power source with the load;
   Hall generator sensor means in proximity with the line for detecting the load current flowing through the line and providing an output voltage in response thereto;
   means for comparing the output voltage with a predetermined value and providing a signal for opening said contact when said output voltage differs from said predetermined value;
   a current transformer corrected to be responsive to the load current flowing in said line for applying power to said circuit breaker, said current transformer comprising first and second secondary windings; and
   a power supply being receptive to said applied power to supply current to said sensor means and said comparing means, said power supply including first and second power circuits, said first secondary winding applying power to said first power circuit for said sensor means, and said second secondary winding applying power to said second power circuit for said comparing means.

3. An electric circuit breaker according to claim 1, wherein said line is constituted as a bus bar and said sensor means further comprises a magnetic core having an air gap in which said first Hall generator is secured, said magnetic core being disposed about the bus bar, and
   an insulator positioned between said second Hall generator and the bus bar.

4. An electric circuit breaker for interrupting load current flowing from a power source through a line to a load, comprising:
   a contact positioned in the line connecting the power source with the load;
   Hall generator sensor means in proximity with the line for detecting the load current flowing through the line and providing an output voltage in response thereto;
   means for comparing the output voltage with a predetermined value and providing a signal for opening said contact when said output voltage differs from said predetermined value;
   a current transformer connected to be responsive to the load current flowing in said line for applying power to said circuit breaker; and
   a power supply being receptive to said applied power to supply current to said sensor means and said comparing means,
   said sensor means and said current transformer having a common magnetic core and said line being constituted as a bus bar, said magnetic core being disposed about said bus bar.

5. An electric circuit breaker according to claim 4, wherein said sensor means comprises a Hall generator and said magnetic core has an air gap in which said Hall generator is secured.

6. An electric circuit breaker comprising:
   a contact positioned in the line connecting the power source with the load;
   a sensor for detecting the load current flowing through the line and providing an output voltage in response thereto;
   means for comparing the output voltage with a predetermined value for providing a signal for opening said contact when said output voltage differs from said predetermined value;
   a current transformer having a magnetic core with an air gap, said magnetic core having first and second secondary windings connected to be responsive to the load current flowing in said line for applying power to said circuit breaker; and a power supply receptive to said applied power to supply current to said sensor and said comparing means.

7. An electric circuit breaker according to claim 6, wherein said power supply includes first and second power circuits, said first power circuit being supplied power by said first secondary winding of said current transformer, said second power circuit being supplied power by said second secondary winding of said current transformer.

8. An electric circuit breaker according to claim 6, wherein said sensor comprises first and second Hall generators, said first Hall generator for detecting a first preset range of the load current and being secured in said air gap of said magnetic core, said line being constituted as a bus bar and said second Hall generator for detecting a second preset range of the load current larger than the first range and being secured to the bus bars by an insulator.

* * * * *